(12) United States Patent
Long et al.

(10) Patent No.: US 11,508,803 B2
(45) Date of Patent: Nov. 22, 2022

(54) ARRAY SUBSTRATE, DISPLAY PANEL AND DISPLAY DEVICE

(71) Applicant: BOE Technology Group Co., Ltd., Beijing (CN)

(72) Inventors: Chunping Long, Beijing (CN); Hui Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 45 days.

(21) Appl. No.: 16/981,734

(22) PCT Filed: Apr. 1, 2020

(86) PCT No.: PCT/CN2020/082849
§ 371 (c)(1),
(2) Date: Sep. 17, 2020

(87) PCT Pub. No.: WO2020/253322
PCT Pub. Date: Dec. 24, 2020

(65) Prior Publication Data
US 2021/0257440 A1  Aug. 19, 2021

(30) Foreign Application Priority Data

Jun. 19, 2019  (CN) .......................... 201920929686.0

(51) Int. Cl.
*H01L 27/32* (2006.01)
*H05K 13/08* (2006.01)

(52) U.S. Cl.
CPC ...... *H01L 27/3279* (2013.01); *H01L 27/3246* (2013.01); *H01L 27/3276* (2013.01); *H05K 13/0885* (2018.08)

(58) Field of Classification Search
CPC ............. H01L 27/3246; H01L 27/3297; H01L 2027/11881; H05K 13/0885
See application file for complete search history.

(56) References Cited

U.S. PATENT DOCUMENTS

2009/0167645 A1  7/2009  Kishi
2019/0103455 A1  4/2019  Song et al.

FOREIGN PATENT DOCUMENTS

| CN | 101777576 A | 7/2010 |
| CN | 107910352 A | 4/2018 |

(Continued)

OTHER PUBLICATIONS

Supplementary European Search Report issued in Corresponding EP Application No. 20 77 1177, dated Jul. 26, 2022.

*Primary Examiner* — Fernando L Toledo
*Assistant Examiner* — Valerie N Newton
(74) *Attorney, Agent, or Firm* — ArentFox Schiff LLP; Michael Fainberg

(57) ABSTRACT

The disclosure discloses an array substrate, a display panel, and a display device. A first power signal line is configured to be formed by electrically connecting a first signal line located in a first source-drain metal layer and a second signal line located in a second source-drain metal layer through a via hole, which is equivalent to that the first power signal line is composed of the first signal line and the second signal line connected in parallel, and the equivalent resistance of the parallel-connected first signal line and second signal line included in the first power signal line is smaller than the resistance of any of the signal lines. Thus, the resistance of the first power signal line may be effectively reduced, so that an IR drop of a display panel with an array substrate may be reduced, and the display uniformity of the display panel is improved.

19 Claims, 12 Drawing Sheets

(56) References Cited

FOREIGN PATENT DOCUMENTS

| | | | |
|---|---|---|---|
| CN | 109166886 A | 1/2019 | |
| CN | 109273516 A | 1/2019 | |
| CN | 209729911 U | 12/2019 | |
| EP | 1 536 465 A1 | 6/2005 | |
| EP | 3637469 A1 * | 4/2020 | ............ H01L 27/32 |
| WO | WO-2018223630 A1 * | 12/2018 | ............ H01L 27/32 |

\* cited by examiner

ARRAY SUBSTRATE, DISPLAY PANEL AND DISPLAY DEVICE

CROSS REFERENCE TO RELATED APPLICATIONS

The present disclosure is a national phase entry under 35 U.S.C. § 371 of International Application No. PCT/CN2020/082849, filed on Apr. 1, 2020, which claims priority of Chinese Patent Application No. 201920929686.0, filed with the China National Intellectual Property Administration (CNIPA) on Jun. 19, 2019, and entitled "ARRAY SUBSTRATE, DISPLAY PANEL AND DISPLAY DEVICE", the entire content of which is incorporated by herein reference.

FIELD

The present disclosure relates to the field of display technology, in particular to an array substrate, a display panel, and a display device.

BACKGROUND

As pixel resolutions of organic light-emitting diode (OLED) display panels are getting higher and higher, and wiring areas in the panels are becoming smaller and smaller, metal wiring is gradually developing toward thinner wires and refinement. This will cause increasingly higher resistances of metal wires, especially increased resistances for some important signal lines, for example, an increase of the resistance of a power signal line (VDD), which increases the IR drop, thereby resulting in display unevenness of a display panel.

SUMMARY

Embodiments of the present disclosure provide an array substrate, including:

a base substrate;

a first source-drain metal layer, located above the base substrate and including a first signal line extending along a first direction;

a first insulating layer, located on a side, facing away from the base substrate, of the first source-drain metal layer; and a second source-drain metal layer, located on a side, facing away from the base substrate, of the first insulating layer and including a second signal line extending along the first direction; the first signal line and the second signal line having an overlapping area and being electrically connected through a via hole, running through the first insulating layer, to form a first power signal line.

Optionally, in specific implementation, the above-mentioned array substrate provided by some embodiments of the present disclosure further includes:

an interlayer insulating layer, located between the base substrate and the first source-drain metal layer; and a first gate metal layer, located between the interlayer insulating layer and the base substrate and comprising a second power signal line extending in a second direction;

the second power signal line being electrically connected to the first signal line through a via hole running through the interlayer insulating layer.

Optionally, in specific implementation, in the above-mentioned array substrate provided by some embodiments of the present disclosure, orthographic projections, on the base substrate, of the via hole running through the interlayer insulating layer and the via hole running through the first insulating layer do not overlap.

Optionally, in specific implementation, in the above-mentioned array substrate provided by some embodiments of the present disclosure, the first gate metal layer further includes a first block electrode electrically connected to the second power signal line, and the second power signal line is electrically connected to the first signal line through the first block electrode.

Optionally, in specific implementation, the above-mentioned array substrate provided by some embodiments of the present disclosure further includes:

a first gate insulating layer, located between the base substrate and the first gate metal layer; and a second gate metal layer, located between the first gate insulating layer and the base substrate and including a second block electrode;

the second block electrode and the first block electrode overlapping to form a storage capacitor.

Optionally, in specific implementation, in the above-mentioned array substrate provided by some embodiments of the present disclosure, an orthographic projection of the first signal line on the base substrate and an orthographic projection of the second signal line on the base substrate overlap.

Optionally, in specific implementation, in the above-mentioned array substrate provided by some embodiments of the present disclosure, the width of the second power signal line is smaller than that of the first signal line.

Optionally, in specific implementation, in the above-mentioned array substrate provided by some embodiments of the present disclosure, the first signal line and the second signal line are electrically connected through a plurality of via holes running through the first insulating layer.

Optionally, in specific implementation, the above-mentioned array substrate provided by some embodiments of the present disclosure further includes an anode layer above the second source-drain metal layer, and a first planarization layer between the second source-drain metal layer and the anode layer, wherein the first source-drain metal layer further includes a drain, the second source-drain metal layer further includes a lapped portion, and the drain is electrically connected to the anode layer through the lapped portion.

Optionally, in specific implementation, in the above-mentioned array substrate provided by some embodiments of the present disclosure, the lapped portion has a first groove, the bottom of which is electrically connected to the drain; and the anode layer has a first connecting portion, which extends into the first groove through a via hole running through the first planarization layer and is electrically connected to the lapped portion.

Optionally, in specific implementation, the above-mentioned array substrate provided by some embodiments of the present disclosure further includes an active layer between the second gate metal layer and the base substrate, wherein the drain has a second groove, the bottom of which is electrically connected to the active layer; and the lapped portion further has a second connecting portion, which extends into the second groove and is electrically connected to the drain.

Optionally, in specific implementation, in the above-mentioned array substrate provided by some embodiments of the present disclosure, the first insulating layer comprises a passivation layer on a side, facing the second source-drain metal layer, of the first source-drain metal layer, and a second planarization layer between the passivation layer and the second source-drain metal layer.

Optionally, in specific implementation, the above-mentioned array substrate provided by some embodiments of the present disclosure further includes a buffer layer between the active layer and the base substrate, and a second gate insulating layer between the active layer and the second gate metal layer.

Correspondingly, some embodiments of the present disclosure further provide a display panel, which includes any above-mentioned array substrate provided by embodiments of the present disclosure.

Correspondingly, some embodiments of the present disclosure further provide a display device, which includes the above-mentioned array substrate provided by embodiments of the present disclosure.

DETAILED DESCRIPTION OF THE EMBODIMENTS

Figure 1:
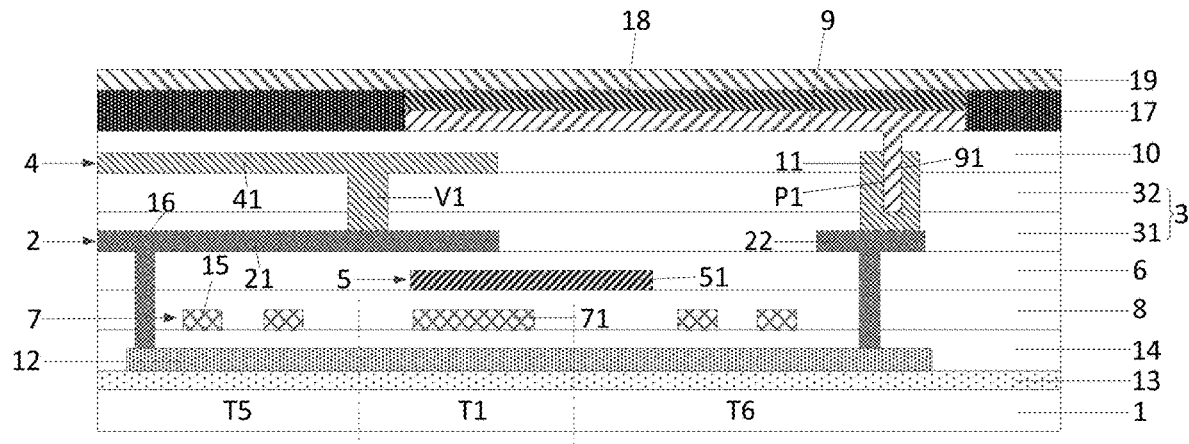
FIG. 1 is a structural diagram of an array substrate provided by an embodiment of the disclosure.

To make the objectives, technical solutions and advantages of the present disclosure clearer, specific implementations of an array substrate, a display panel, and a display device provided by embodiments of the present disclosure will be described in detail below in conjunction with the accompanying drawings.

The thickness and shape of each layer of the film in the drawings do not reflect the true scale of the array substrate, and are merely intended to illustrate the present disclosure.

Figure 2:
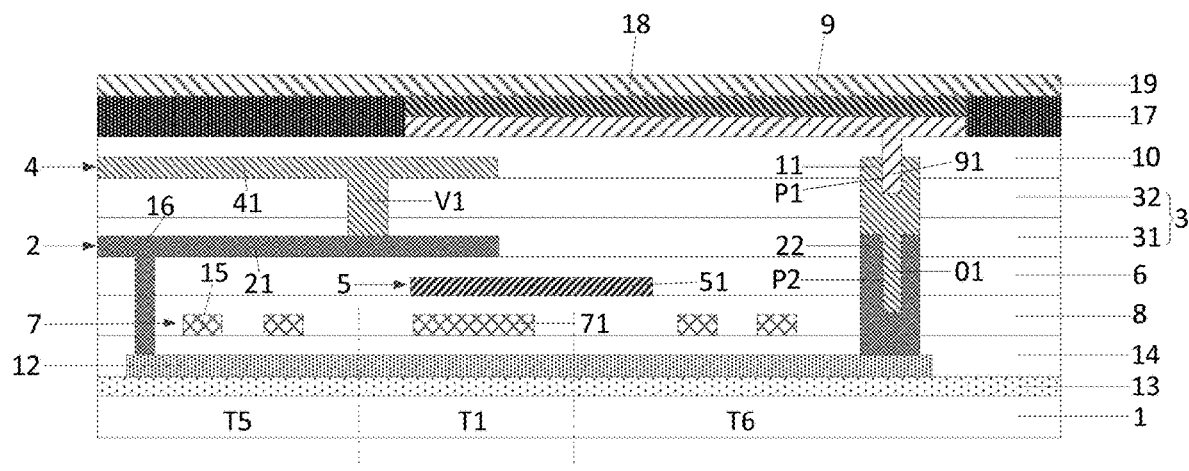
FIG. 2 is another structural diagram of an array substrate provided by an embodiment of the disclosure.
Figure 3A:
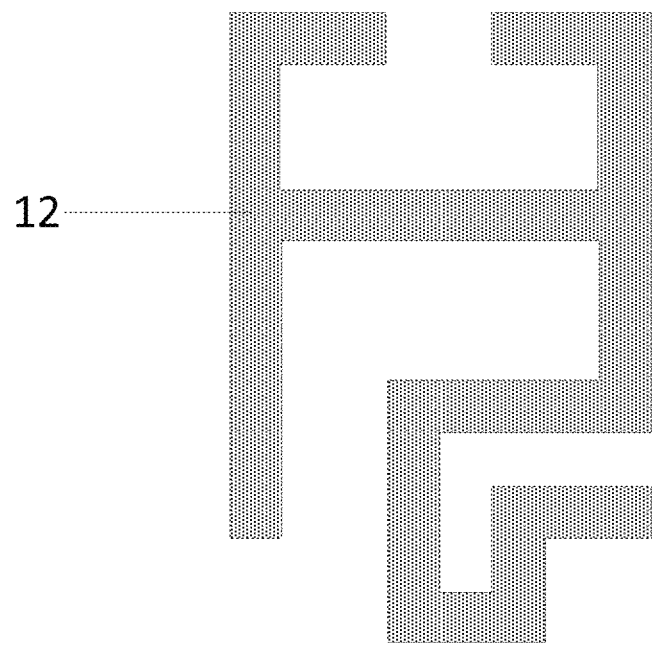
FIGS. 3A to 3I are top-view structure diagrams of an array substrate after respective operations of a method for preparing the array substrate, provided by an embodiment of the disclosure, have been performed.
Figure 3B:
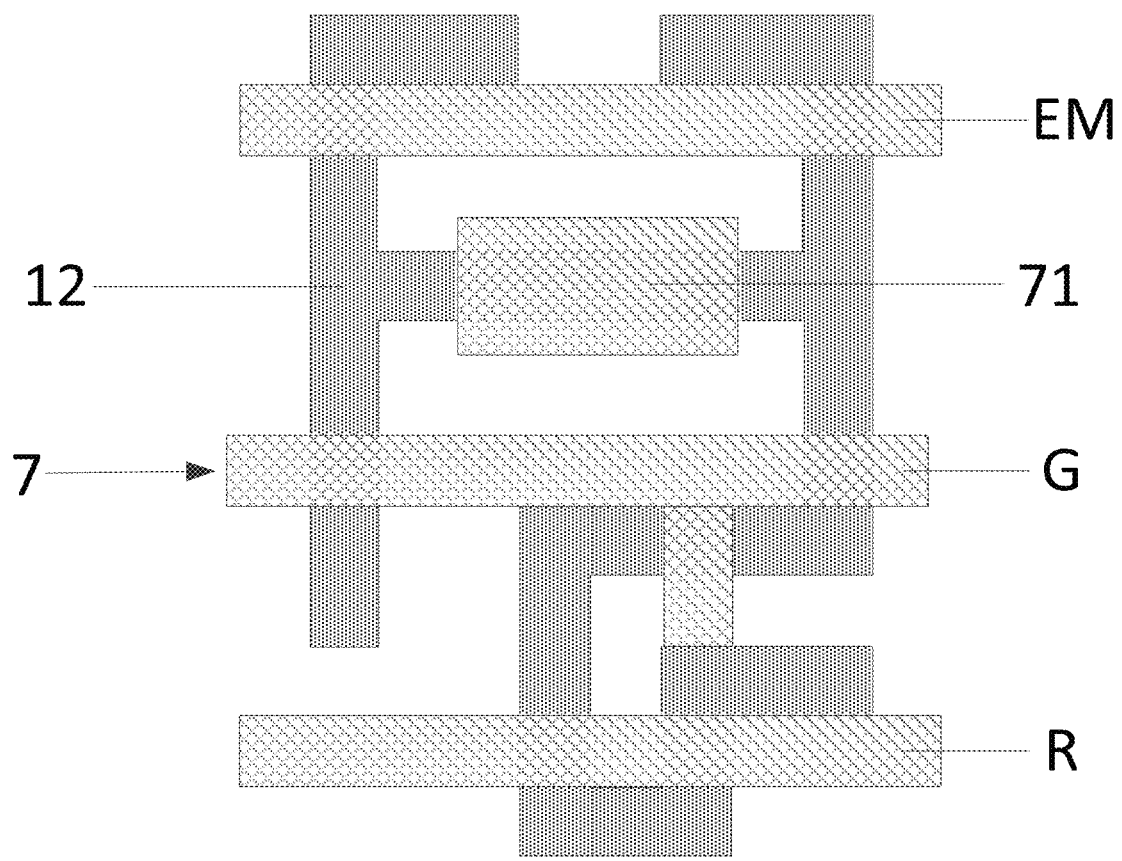
Figure 3C:
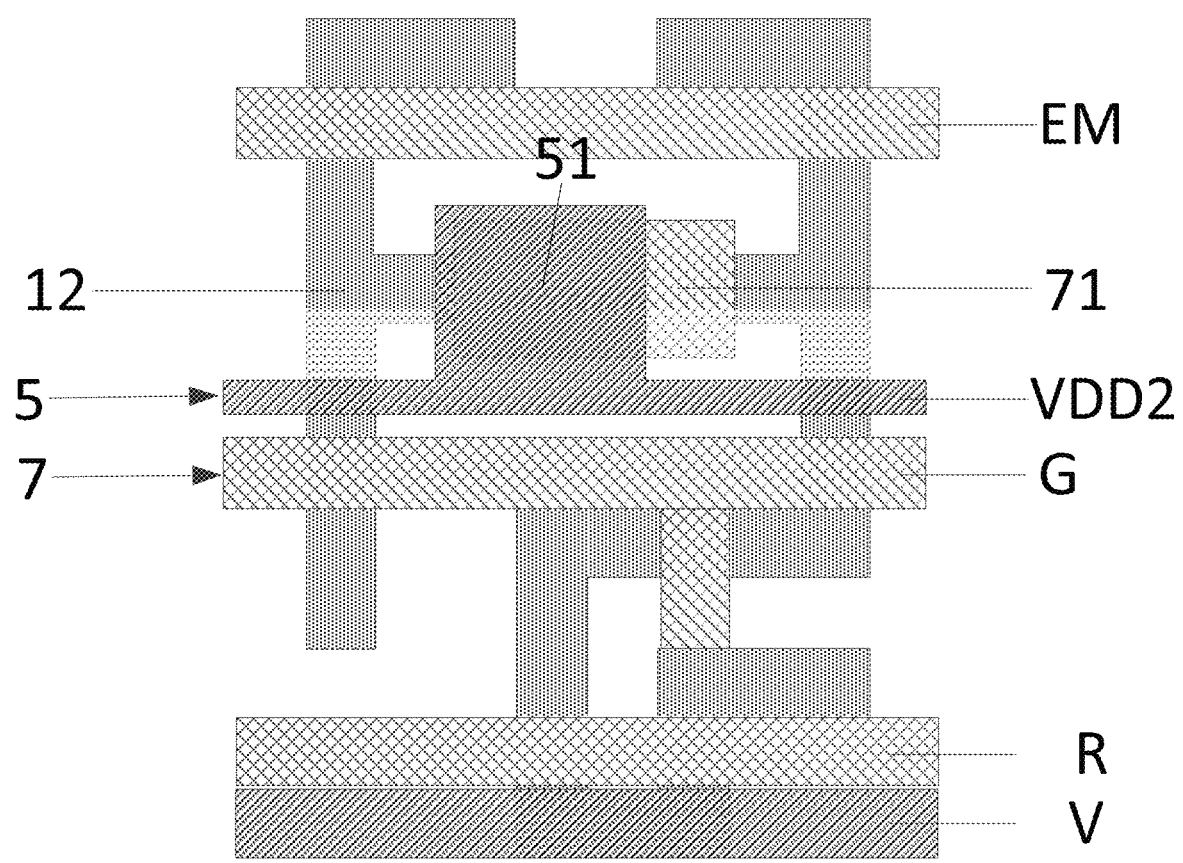
Figure 3D:
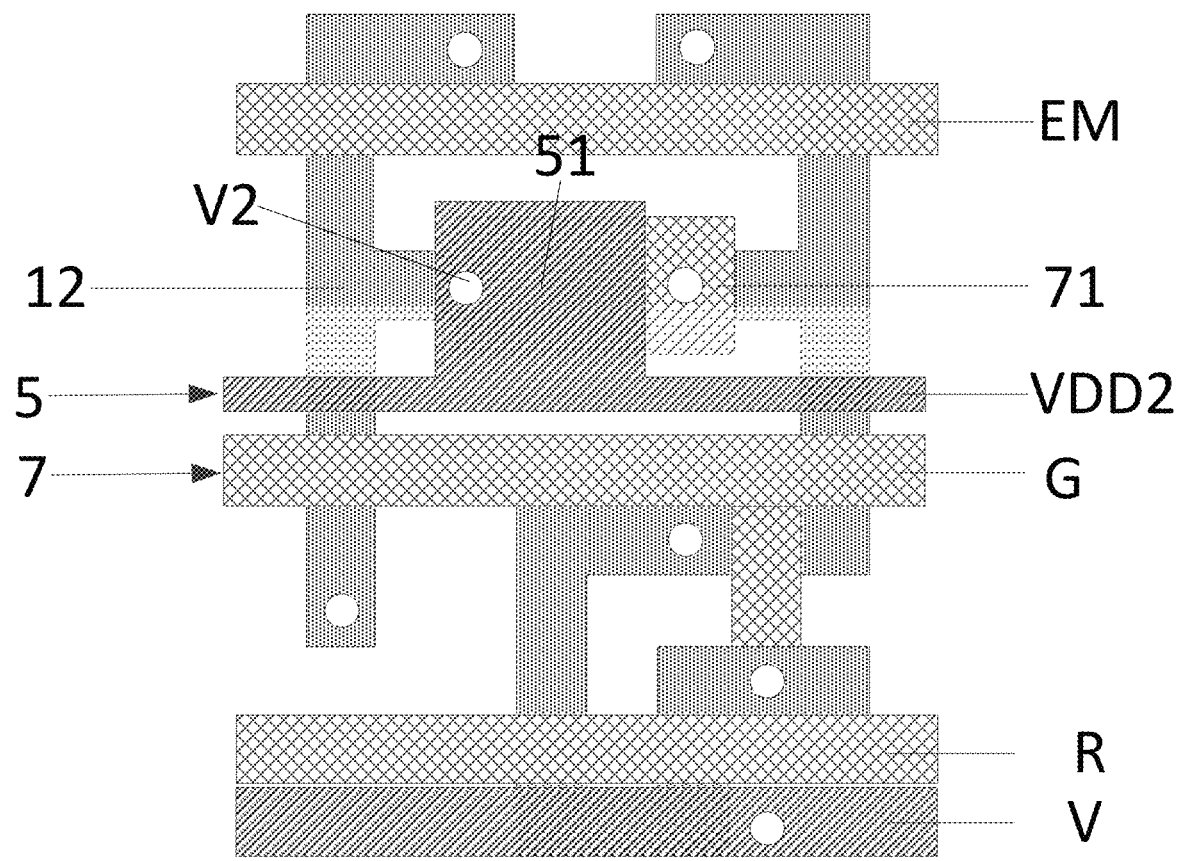
Figure 3E:
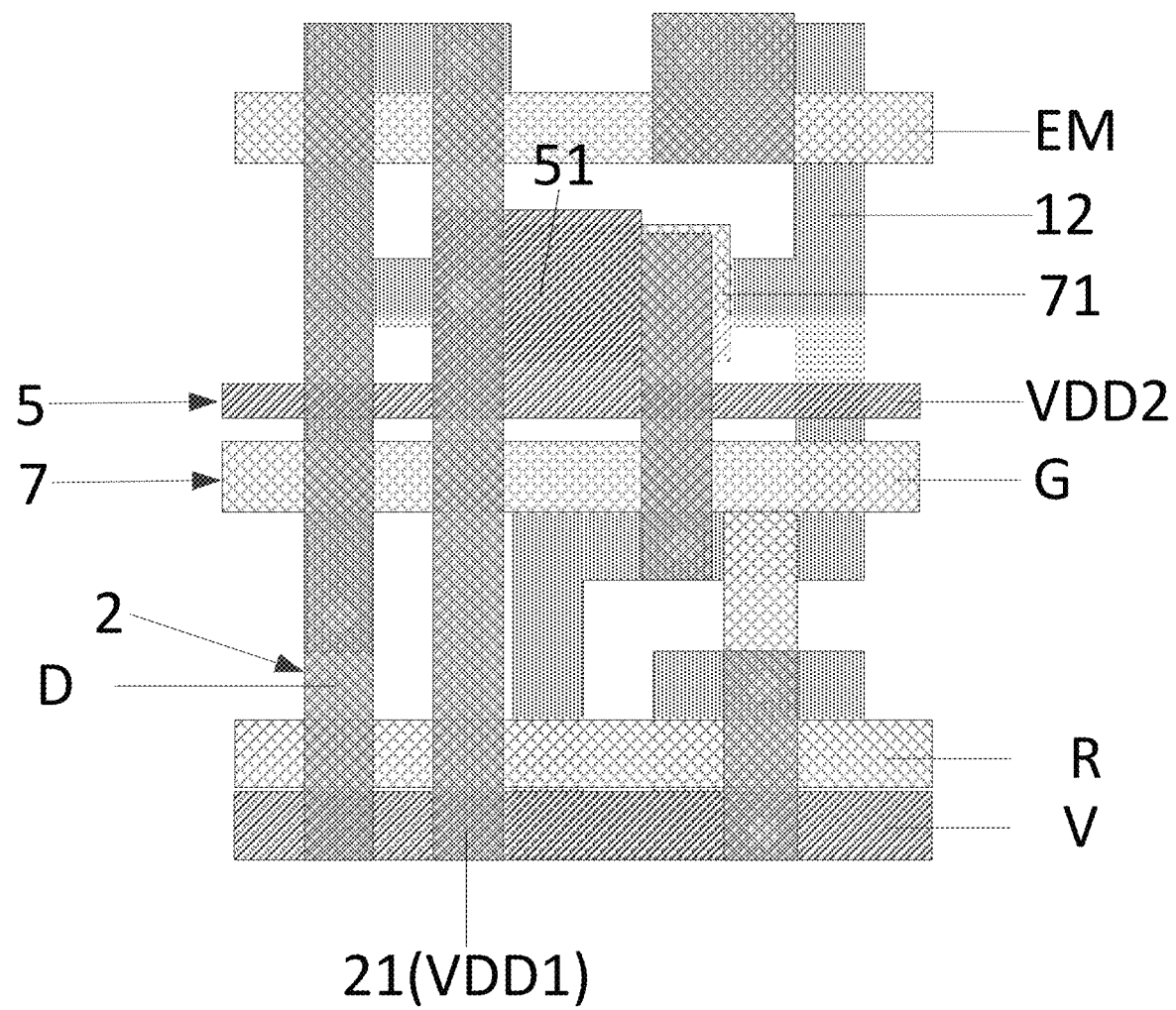
Figure 3F:
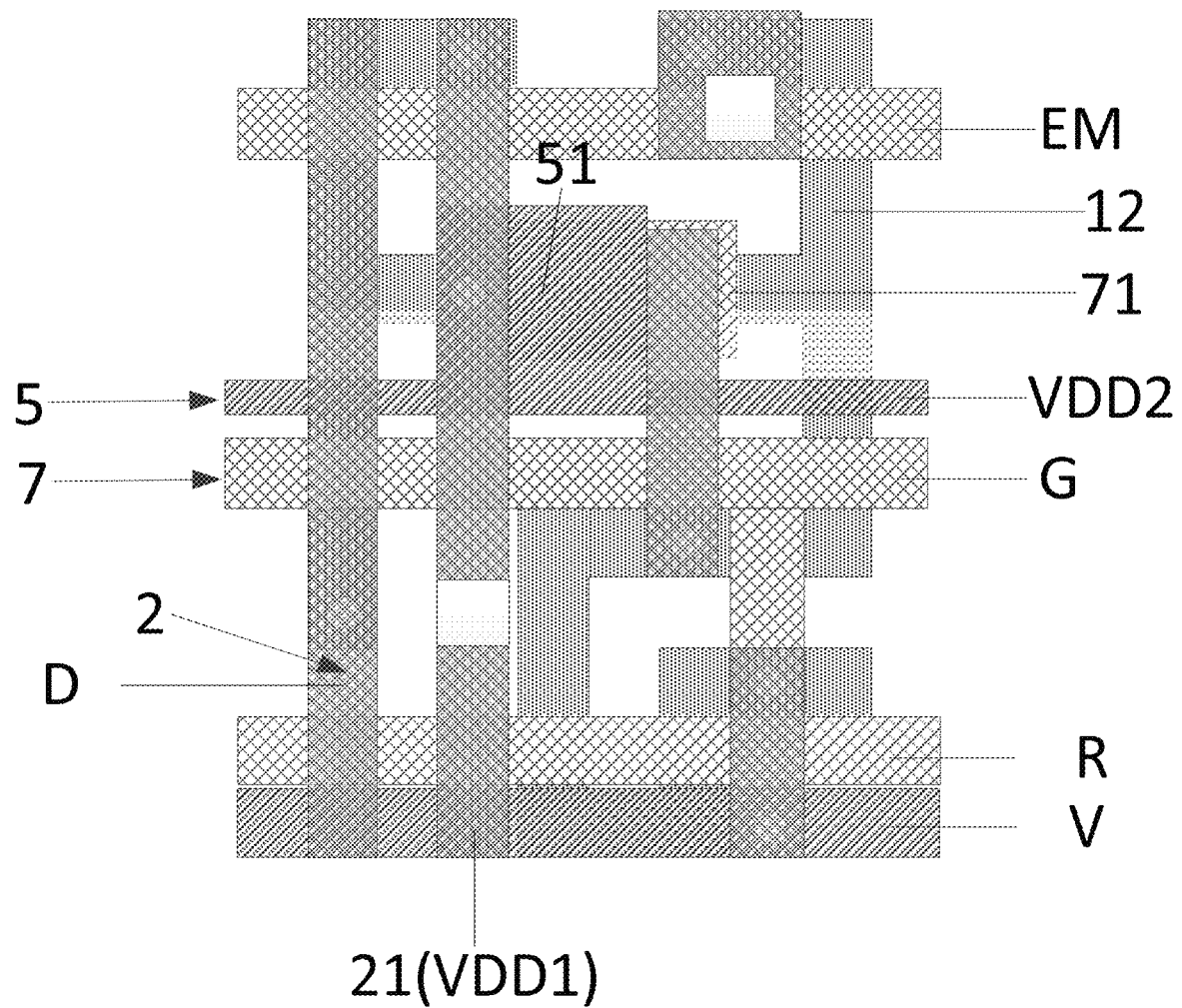
Figure 3G:
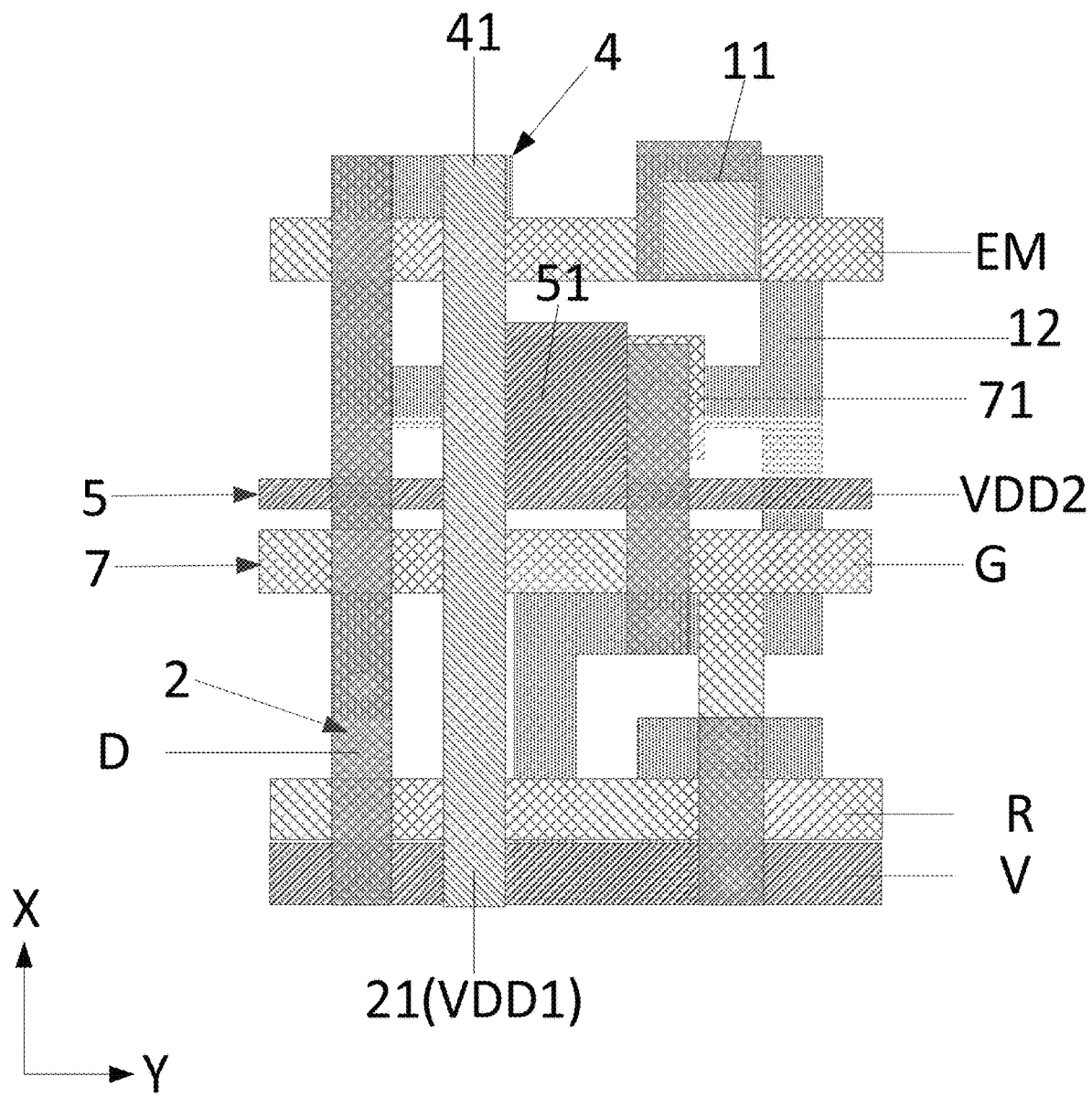

An array substrate provided by some embodiments of the present disclosure is shown in FIGS. 1, 2 and 3G. FIG. 1 is a cross-sectional structure diagram of the array substrate, and FIG. 3G is a top-view structure diagram of the array substrate shown in FIG. 1. The array substrate includes a base substrate 1, and a first source-drain metal layer 2, a first insulating layer 3 and a second source-drain metal layer 4 stacked successively above the base substrate 1.

The first source-drain metal layer 2 includes a first signal line 21, and the second source-drain metal layer 4 includes a second signal line 41. Both the first signal line 21 and the second signal line 41 extend along a first direction X. In the array substrate, each column of pixel circuit corresponds to one first signal line 21 and one second signal line 41. Therefore, it may be considered that the first signal line(s) 21 are in one-to-one correspondence with the second signal line(s) 41. The first signal line 21 and the second signal line 41 in one-to-one correspondence have an overlapping area, and the first signal line 21 and the second signal line 41 in one-to-one correspondence are electrically connected through a via hole V1 running through the first insulating layer 3 to form a first power signal line VDD1.

In the array substrate provided by some embodiments of the present disclosure, the first power signal line is configured to be formed by electrically connecting the first signal line 21 located in the first source-drain metal layer 2 and the second signal line 41 located in the second source-drain metal layer 4 through the via hole V1, which is equivalent to that the first power signal line VDD1 is composed of the first signal line 21 and the second signal line 41 connected in parallel, and the equivalent resistance of the parallel-connected first signal line 21 and second signal line 41 included in the first power signal line VDD1 is smaller than the resistance of any of the signal lines. Thus, the resistance of the first power signal line VDD1 may be effectively reduced, so that an IR drop of a display panel with the array substrate may be reduced, and the display uniformity of the display panel is improved.

Optionally, in specific implementation, the above-mentioned array substrate provided by some embodiments of the present disclosure, as shown in FIGS. 1 and 2, may further include a first gate metal layer 5 and an interlayer insulating layer 6 disposed between the base substrate 1 and the first source-drain metal layer 2 in a stacked manner. The first gate metal layer 5 is disposed close to the base substrate 1, and the interlayer insulating layer 6 is disposed close to the first source-drain metal layer 2.

As shown in FIGS. 3C and 3D, the first gate metal layer 5 includes a second power signal line VDD2 extending in a second direction Y, and the second power signal line VDD2 is electrically connected to the first signal line 21 through a via hole V2 running through the interlayer insulating layer 6. In this way, by electrically connecting the second power signal line VDD2 to the first signal line 21, the resistance of the first power signal line VDD1 may be further reduced, the IR drop of the display panel with the array substrate is further reduced, and the display uniformity of the display panel is further improved.

Optionally, in specific implementation, in the above-mentioned array substrate provided by some embodiments of the present disclosure, orthographic projections, on the base substrate 1, of the via hole V2 running through the interlayer insulating layer 6 and the via hole V1 running through the first insulating layer 3 are generally set not to overlap each other, that is, they are set in a staggered manner.

Optionally, in specific implementation, as the widths of the power signal lines are generally narrow, to increase the contact area between the signal lines and reduce the resistance, in the above-mentioned array substrate provided by some embodiments of the present disclosure, as shown in FIGS. 1, 2 and 3E, the first gate metal layer 5 may further include a first block electrode 51 electrically connected to the second power signal line VDD2, and the second power signal line VDD2 may be electrically connected to the first signal line 21 through the first block electrode 51.

Optionally, in specific implementation, the above-mentioned array substrate provided by some embodiments of the present disclosure, as shown in FIGS. 1 and 2, may further include a second gate metal layer 7 and a first gate insulating layer 8 disposed between the base substrate 1 and the first gate metal layer 5 in a stacked manner. The second gate metal layer 7 is disposed close to the base substrate 1, and the first gate insulating layer 8 is disposed close to the first gate metal layer 5.

Figure 4:
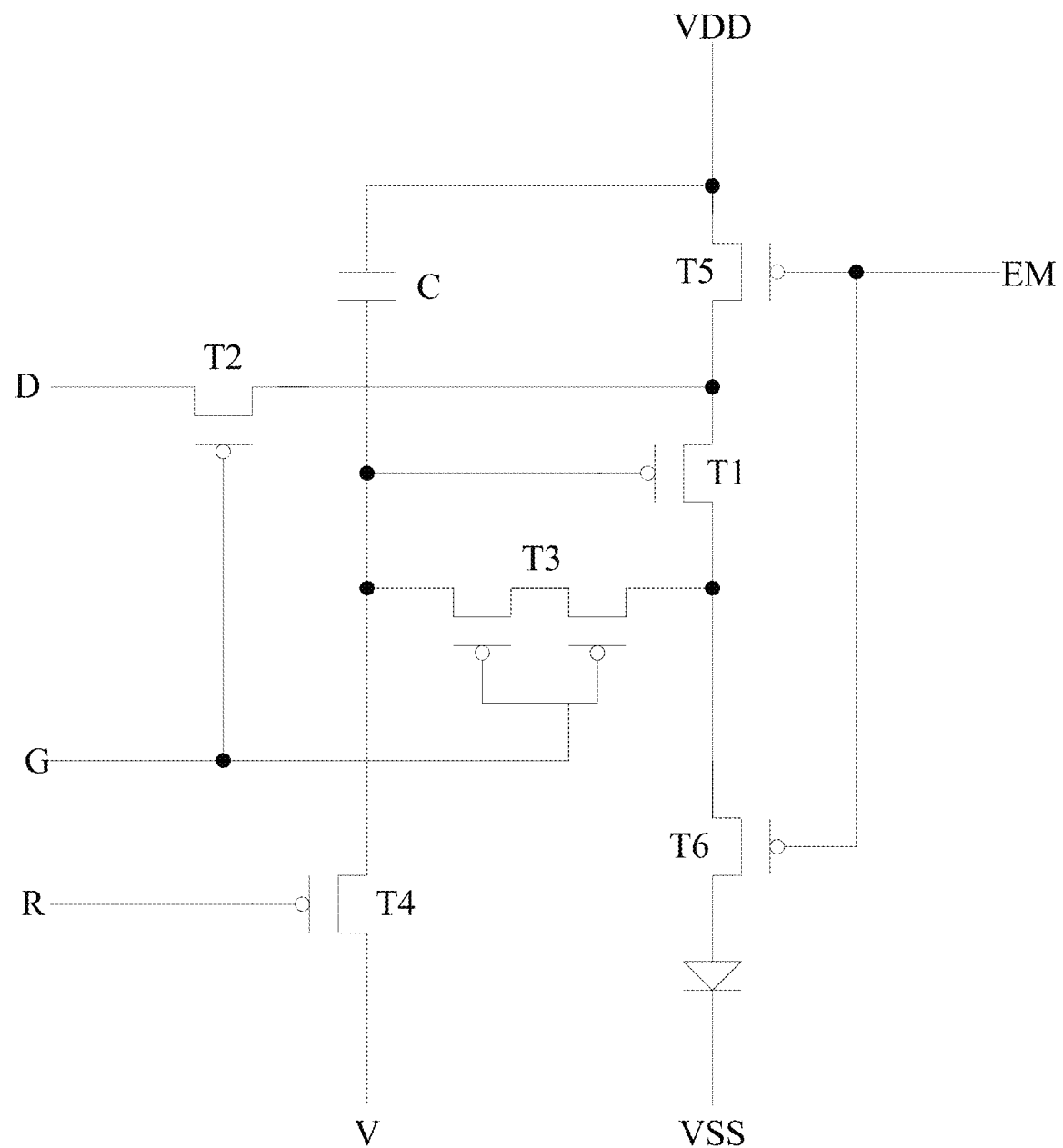
FIG. 4 is an equivalent circuit diagram corresponding to a pixel circuit in an array substrate provided by an embodiment of the disclosure.

The second gate metal layer 7 includes a second block electrode 71. The second block electrode 71 and the first block electrode 51 overlap each other to form a storage capacitor C in the pixel circuit, as shown in FIG. 4. Generally, only one storage capacitor C is provided in the pixel circuit, so it may be considered that the second block electrode 71 and the first block electrode 51 are arranged in one-to-one correspondence. Specifically, the shape of the second block electrode 71 may be of any shape, and may be set as required in specific implementation.

Optionally, in specific implementation, in the above-mentioned array substrate provided by some embodiments of the present disclosure, as shown in FIG. 3G, an orthographic projection of the first signal line 21 on the base substrate 1 at least partially overlaps an orthographic projection of the second signal line 41 on the base substrate 1. In this way, the electrical connection between the first signal line 21 and the second signal line 41 may be achieved through the via hole running through the first insulating layer 3 which is located between the first signal line 21 and the second signal line 41 and corresponds to the overlapping area. In specific implementation, to increase the contact area between the first signal line 21 and the second signal line 41 to reduce the contact resistance, the width of the first signal line 21 and the width of the second signal line 41 (that is, their orthographic projections on the base substrate 1) may be set to completely overlap.

Optionally, in specific implementation, in the above-mentioned array substrate provided by some embodiments of the present disclosure, as shown in FIG. 3E, the width of the second power signal line VDD2 is generally smaller than the width of the first signal line 21, so that the layout structure of the pixel circuit is more compact, which is conducive to improving the PPI. The width of the second power signal line VDD2 refers to an average width of the second power signal line VDD2 in a pixel, and the width of the first signal line 21 refers to an average width of the first signal line 21 in the pixel.

Optionally, in specific implementation, to further increase the contact area between the first signal line 21 and the second signal line 41 to reduce the resistance of the first power signal line VDD1, in the above-mentioned array substrate provided by some embodiments of the present disclosure, the first signal line 21 and the second signal line 41 may be electrically connected through a plurality of via holes V1 running through the first insulating layer 3.

Optionally, in specific implementation, the above-mentioned array substrate provided by some embodiments of the present disclosure, as shown in FIGS. 1 and 2, may further include an anode layer 9 above the second source-drain metal layer 4, and a first planarization layer 10 between the second source-drain metal layer 4 and the anode layer 9. The first source-drain metal layer 2 may further include a drain 22, and the second source-drain metal layer 4 may further include a lapped portion 11, the drain 22 is electrically connected to the anode layer 9 through the lapped portion 11. Due to a large height difference between the anode layer 9 and the drain 22, during the process of evaporating the anode layer 9 to electrically connect the anode layer to the drain 22, a wire breaking risk is very likely to occur, resulting poor contact between the anode layer 9 and the drain 22. In the present disclosure, the second source-drain metal layer 4 is provided with the lapped portion 11, and firstly the drain 22 is electrically connected to the lapped portion 11, and then the lapped portion 11 is electrically connected to the anode layer 9, thereby achieving the electrical connection between the drain 22 and the anode layer 9, thus reducing a height difference between the anode layer 9 and the drain 22 and reducing the wire breaking risk.

Optionally, in specific implementation, in the above-mentioned array substrate provided by some embodiments of the present disclosure, as shown in FIGS. 1 and 2, the lapped portion 11 may have a first groove P1, and the bottom of the first groove P1 is electrically connected to the drain 22.

The anode layer 9 may have a first connecting portion 91, and the first connecting portion 91 extends into the first groove P1 through a via hole running through the first planarization layer 10 and is electrically connected to the lapped portion 11. In this way, the contact area between the first connecting portion 91 and the lapped portion 11 may be increased, and the connecting resistance between the anode layer 9 and the drain 22 is further reduced.

Optionally, in specific implementation, the above-mentioned array substrate provided by some embodiments of the present disclosure, as shown in FIG. 2, may further include an active layer 12 between the second gate metal layer 7 and the base substrate 1, and the drain 22 has a second groove P2, the bottom of the second groove P2 is electrically connected to the active layer 12.

The lapped portion 11 further has a second connecting portion 01, the second connecting portion 01 extends into the second groove P2 and is electrically connected to the drain 22. By extending the second connecting portion 01 of the lapped portion 11 into the second groove P2 and electrically connecting the second connecting portion 01 to the drain 22, the contact area between the lapped portion 11 and the drain 22 may be increased, thereby reducing the contact resistance of the lapped portion 11 and the drain 22, and further improving the contact reliability between the anode layer 9 and the drain 22, thereby further improving the display uniformity of the display panel.

Optionally, in specific implementation, the above-mentioned array substrate provided by some embodiments of the present disclosure, as shown in FIGS. 1 and 2, may further include a thin film transistor structure between the base substrate 1 and the first insulating layer 3. The thin film transistor specifically includes the active layer 12, a gate 15, a source 16 and the drain 22, and these film layers are same as those in the related art and will not be described in detail here.

In specific implementation, as shown in FIGS. 1 and 2, the first signal line 21 may be arranged in the same layer as the source 15 and drain 22 of the thin film transistor. Thus, it only needs to change the original patterning form in the formation of the source 15 and the drain 22, to form patterns of the first signal line 21 and the source 15 and the drain 22 by one patterning process, without adding a process for separately preparing the first signal line 21, so that the preparation process may be simplified, the manufacturing cost is reduced, and the manufacturing efficiency is improved.

In specific implementation, as shown in FIGS. 1 and 2, the second signal line 41 may be arranged in the same layer as the lapped portion 11, and patterns of the second signal line 41 and the lapped portion 11 may be formed by one patterning process, so that the preparation process may be simplified, the manufacturing cost is reduced, and the manufacturing efficiency is improved.

Optionally, in specific implementation, in the above-mentioned array substrate provided by some embodiments of the present disclosure, as shown in FIGS. 1 and 2, the first insulating layer 3 specifically includes a passivation layer 31 on a side, facing the second source-drain metal layer 4, of the first source-drain metal layer 2, and a second planarization layer 32 between the passivation layer 31 and the second source-drain metal layer 4. That is, in the present disclosure, after the thin film transistor is prepared, to protect the thin film transistor from damage by the subsequent preparation process, a passivation layer 31 is formed above the thin film transistor, and to ensure the uniformity of the thickness of each film layer of the array substrate, it also needs to prepare a second planarization layer 32.

Optionally, in specific implementation, in the above-mentioned array substrate provided by some embodiments of the present disclosure, as shown in FIGS. 1 and 2, to prevent impurities in the base substrate 1 from diffusing to the active layer 12, the array substrate may further include a buffer layer 13 between the active layer 12 and the base substrate 1, and a second gate insulating layer 14 between the active layer 12 and the second gate metal layer 7.

In specific implementation, the above-mentioned array substrate provided by some embodiments of the present disclosure, as shown in FIGS. 1 and 2, may further include a pixel defining layer 17 for defining each pixel area, a light-emitting layer 18 located above the anode layer 9 and in the pixel area defined by the pixel defining layer 17, and a cathode layer 19 above the light-emitting layer 18, and these film layers are same as those in the related art and will not be described in detail here.

A method for preparing the array substrate shown in FIG. 2 provided by the present disclosure will be described in detail below through some specific embodiments.

(1) A buffer layer 13 is formed on a base substrate 1, and an active layer 12 is formed on the buffer layer 13, as shown in FIG. 3A. It should be noted that FIG. 3A only illustrates a pattern of the active layer 12.

(2) A second gate insulating layer 14 is formed above the active layer 12, and a gate line G, a second block electrode 71, a light emission control signal line EM and a reset signal line R are formed on the second gate insulating layer 14 by one patterning process, and the gate line G, the second block electrode 71, the light emission control signal line EM and the reset signal line R are located in a same second gate metal layer 7, as shown in FIG. 3B.

(3) A first gate insulating layer 8 is formed above the second gate metal layer 7, and a second power signal line VDD2, a first electrode block 51 and an initialization signal line V are formed above the first gate insulating layer 8 by one patterning process. The second power signal line VDD2, the first electrode block 51 and the initialization signal line V are in a same first gate metal layer 5, and the second power signal line VDD2 is electrically connected with the first block electrode 51, as shown in FIG. 3C.

(4) An interlayer insulating layer 6 is formed above the first gate metal layer 5, as shown in FIG. 3D. It should be noted that as a source and a drain to be formed subsequently are electrically connected to the active layer 12 through via holes running through the interlayer insulating layer 6, the first gate insulating layer 8 and the second gate insulating layer 14, and a first signal line 21 to be formed subsequently is electrically connected to the first block electrode 51 through a via hole running through the interlayer insulating layer 6, thus, to clearly illustrate the preparation process, circles are used in FIG. 3D to represent the via holes.

(5) The source 16, the drain 22, the first signal line 21 and a data signal line D are formed above the interlayer insulating layer 6 by one patterning process. The source 16, the drain 22, the first signal line 21 and the data signal line D are in a same first source-drain metal layer 2; the source 16 and the drain 22 are electrically connected to the active layer 12 through the via holes running through the interlayer insulating layer 6, the first gate insulating layer 8 and the second gate insulating layer 14; and the drain 22 has a second groove P2, as shown in FIG. 3E.

(6) A passivation layer 31 is formed above the first source-drain metal layer 2, and a second planarization layer 32 is formed above the passivation layer 31, as shown in FIG. 3F. It should be noted that as a second signal line 41 to be formed subsequently is electrically connected to the first signal line 21 through a via hole running through the passivation layer 31 and the second planarization layer 32, and an anode layer 9 to be formed subsequently needs to be electrically connected to the lapped portion 11 through a via hole running through the second planarization layer 32, thus, to clearly illustrate the preparation process, squares are used in FIG. 3F to represent the via holes running through the passivation layer 31 and the second planarization layer 32.

(7) The second signal line 41 and the lapped portion 11 are formed above the second planarization layer 32 by one patterning process. The second signal line 41 and the lapped portion 11 are located in a same second source-drain metal layer 4; the second signal line 41 is electrically connected to the first signal line 21 through a via hole running through the passivation layer 31 and the second planarization layer 32; the lapped portion 11 is electrically connected to the drain 22 through a via hole running through the passivation layer 31 and the second planarization layer 32; and the lapped portion 11 has a first groove P1 and a second connecting portion 01, the second connecting portion 01 extends into the second groove P2 and is electrically connected to the drain 22, as shown in FIG. 3G.

Figure 3H:
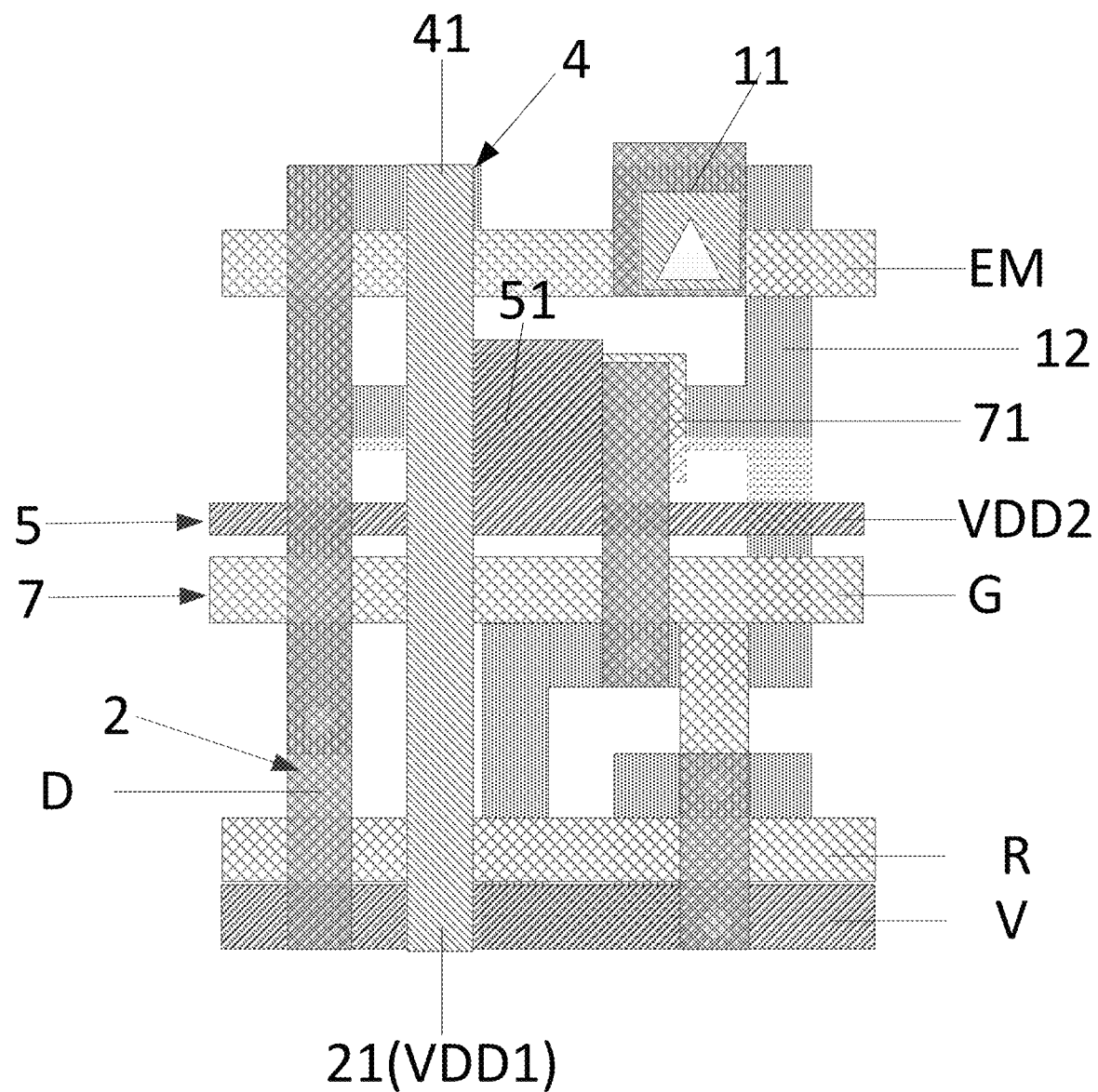

(8) A first planarization layer 10 is formed on the second source-drain metal layer 4, as shown in FIG. 3H. It should be noted that as an anode layer 9 to be formed subsequently needs to be electrically connected to the lapped portion 11 through a via hole running through the first planarization layer 10, thus, to clearly illustrate the preparation process, a triangle is used in FIG. 3H to represent the via hole running through the first planarization layer 10.

Figure 3I:
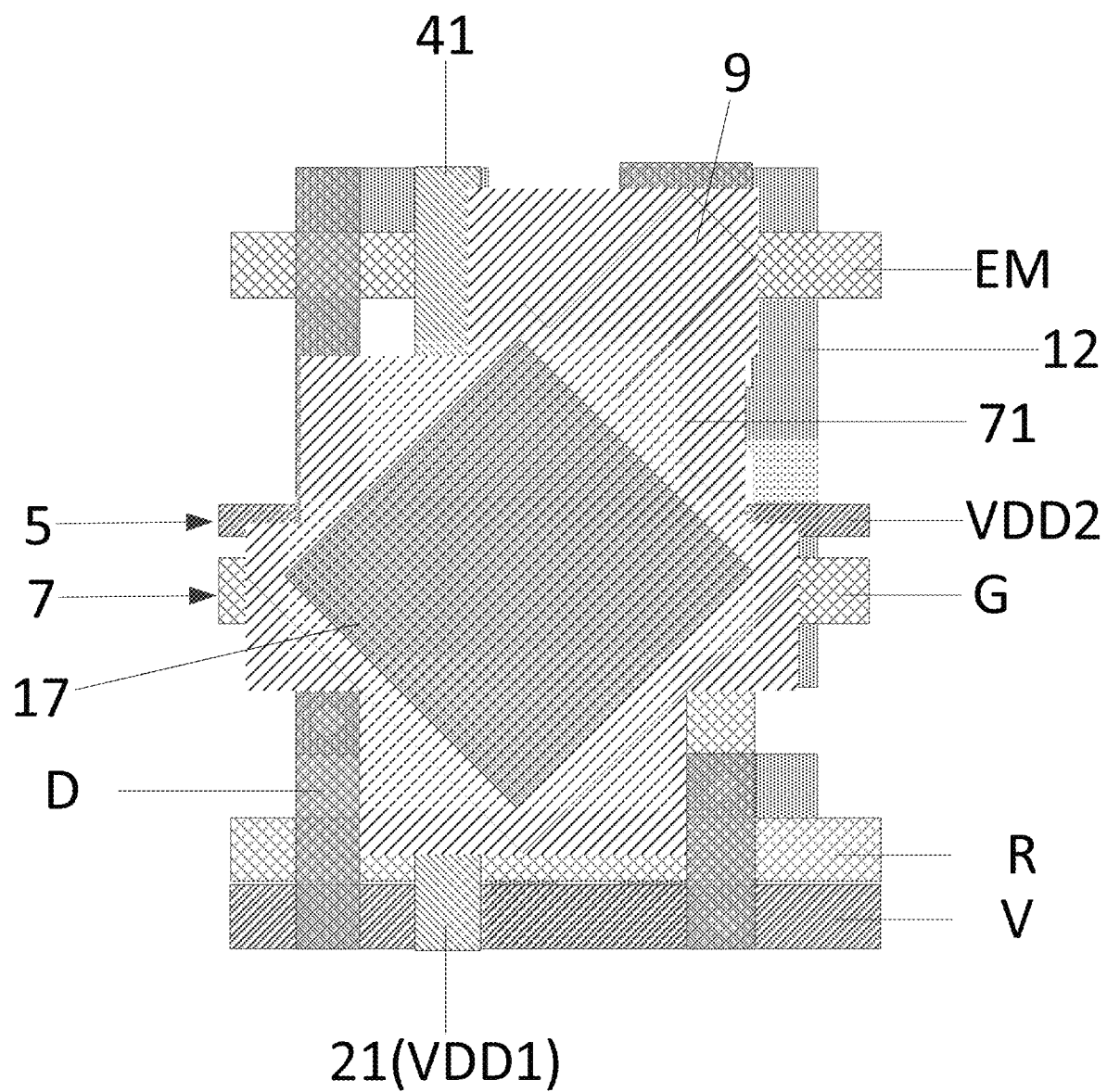

(9) An anode layer 9 is formed above the first planarization layer 10, the anode layer 9 extends into the first groove P1 of the lapped portion 11 through a via hole that runs through the first planarization layer 10, and the anode layer 9 is electrically connected to the lapped portion 11; and a pixel defining layer 17 is formed above the anode layer 9, the pixel defining layer 17 has an opening area that exposes a central area of the anode layer 9, as shown in FIG. 3I.

In specific implementation, after a pattern of the pixel defining layer 17 is formed, other functional film layers such as a light-emitting layer 18 and a cathode layer 19 are also formed, which is not described in detail here.

The array substrate shown in FIG. 2 of the embodiments of the present disclosure may be manufactured through the above operations.

It should be noted that in the above-mentioned method for preparing the array substrate provided by the present disclosure, as the film layers are evaporated, layer by layer, on the base substrate, a film layer deposited earlier is covered by a film layer deposited later, and the top-view structure diagrams in the preparation method of the present disclosure are only intended to illustrate the process of preparing the film layers.

It should be noted that, in the above-mentioned method for preparing the array substrate provided by some embodiments of the present disclosure, the patterning process may only include a photolithography process, or may include a photolithography process and an etching step, and may also include other processes for forming predetermined patters such as printing, and inkjet processes; and the photolithography process refers to a process for forming patterns by using a photoresist, a mask, an exposure machine and the like, including film formation, exposure, development and other process steps. In specific implementation, a corresponding patterning process may be selected according to the structure formed in the present disclosure.

Specifically, an equivalent circuit diagram of a pixel circuit in the above-mentioned array substrate provided by some embodiments of the present disclosure is shown in FIG. 4. One pixel circuit may include a first transistor T1, a second transistor T2, a third transistor T3, a fourth transistor T4, a fifth transistor T5, a sixth transistor T6, and a storage capacitor C. The first transistor T1 is a driving transistor, and the second to sixth transistors T2-T6 are switching transistors. Gates of the second transistor T2 and the third transistor T3 are respectively electrically connected to the gate line G; a source of the second transistor T2 is electrically connected to the data signal line D, and a drain of the second transistor T2 is electrically connected to a source of the first transistor T1; a source of the third transistor T3 is electrically connected to a gate of the first transistor T1, and a drain of the third transistor T3 is electrically connected to a drain of the first transistor T1; a gate of the fourth transistor T4 is electrically connected to the reset signal line R, and a source of the fourth transistor T4 is electrically connected to the initialization signal line V, and a drain of the fourth transistor T4 is electrically connected to the gate of the first transistor T1; a gate of the fifth transistor T5 and a gate of the sixth transistor T6 are respectively electrically connected to the light emission control signal line EM; a source of the fifth transistor T5 is electrically connected to the power signal line VDD, and a drain of the fifth transistor T5 is electrically connected to the source of the first transistor T1; a source of the sixth transistor T6 is electrically connected to the drain of the first transistor T1, and a drain of the sixth transistor T6 is electrically connected to an anode of a light emitting device; and the storage capacitor C is connected between the gate of the first transistor T1 and the power signal line VDD.

Figure 5:
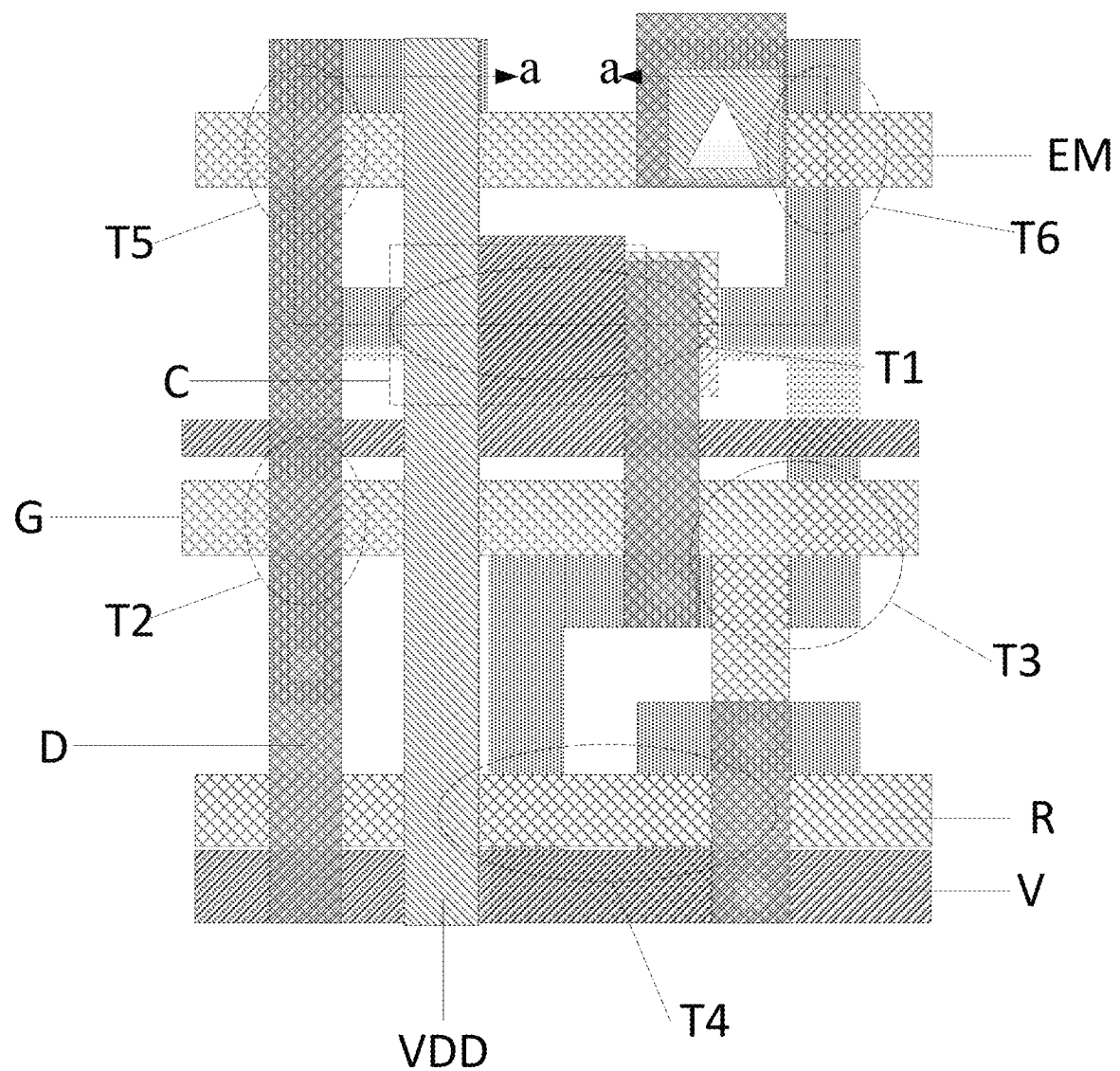
FIG. 5 is a schematic diagram of structures, corresponding to the equivalent circuit diagram of FIG. 4, in an array substrate provided by an embodiment of the disclosure.

A structural diagram of film layers of the transistors corresponding to the equivalent circuit diagram of FIG. 4 is shown in FIG. 5, and FIGS. 1 and 2 are cross-sectional diagrams along a direction aa in FIG. 5. In FIG. 5, for the convenience of the view, a film layer pattern of the light emitting device is not shown. FIGS. 1 and 2 show cross-sectional views of the first transistor T1, the fifth transistor T5, the sixth transistor T6, and the storage capacitor C.

Based on the same inventive concept, embodiments of the present disclosure further provide a display panel, which includes any above-mentioned array substrate provided by embodiments of the present disclosure. The problem-solving principle of the display panel is similar to that of the above-mentioned array substrate, and thus for the implementation of the display panel, reference may be made to the implementation of the above-mentioned array substrate, and repeated description is omitted here.

Based on the same inventive concept, embodiments of the present disclosure further provide a display device, which includes the above-mentioned display panel provided by some embodiments of the present disclosure. The problem-solving principle of the display device is similar to that of the above-mentioned array substrate, and thus for the implementation of the display device, reference may be made to the implementation of the above-mentioned array substrate, and repeated description is omitted here.

In specific implementation, the above-mentioned display device provided by some embodiments of the present disclosure may be a full-screen display device, or may also be a flexible display device or the like, which is not limited here.

Figure 6:
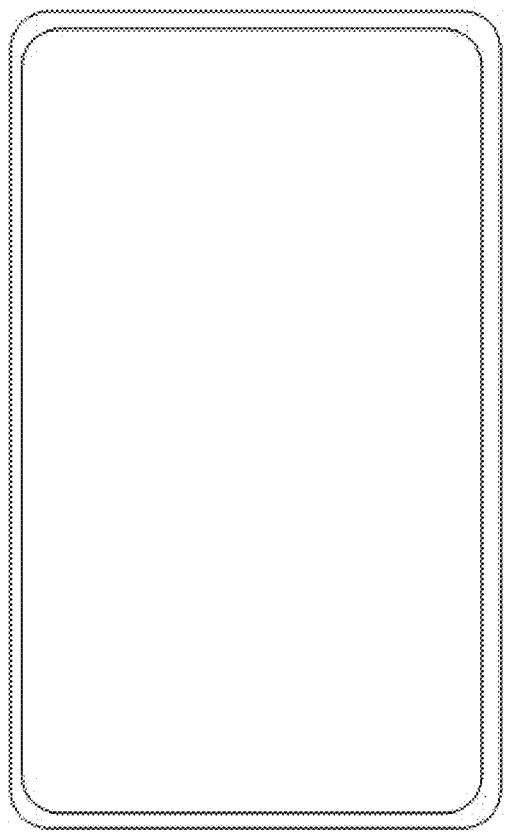
FIG. 6 is a structural diagram of a display device provided by an embodiment of the present disclosure.

In specific implementation, the above-mentioned display device provided by some embodiments of the present disclosure may be a full-screen mobile phone as shown in FIG. 6. Of course, the above-mentioned display device provided in some embodiments of the present disclosure may also be a tablet computer, a television, a display, a notebook computer, a digital photo frame, a navigator, or any other product or component with a display function. Other indispensable components of the display device are present as understood by those skilled in the art, and are not described herein, nor should they be construed as limiting the present disclosure.

In the array substrate, the display panel, and the display device provided by some embodiments of the present disclosure, the array substrate includes a base substrate, and a first source-drain metal layer, a first insulating layer and a second source-drain metal layer stacked successively on the base substrate. The first source-drain metal layer includes a first signal line, and the second source-drain metal layer includes a second signal line; both the first signal line and the second signal line extend along a first direction; and the first signal line and the second signal line have an overlapping area and are electrically connected through a via hole running through the first insulating layer to form a first power signal line. In the present disclosure, the first power signal line is configured to be formed by electrically connecting the first signal line located in the first source-drain metal layer and the second signal line located in the second source-drain metal layer through the via hole, which is equivalent to that the first power signal line is composed of the first signal line and the second signal line connected in parallel, and the equivalent resistance of the parallel-connected first signal line and second signal line included in the first power signal line is smaller than the resistance of any of the signal lines. Thus, the resistance of the first power signal line may be effectively reduced, so that an IR drop of a display panel with the array substrate may be reduced, and the display uniformity of the display panel is improved.

Evidently, those skilled in the art can make various modifications and variations to the present disclosure without departing from the spirit and scope of the present disclosure. Thus, the present disclosure is also intended to encompass these modifications and variations thereto so long as the modifications and variations come into the scope of the claims appended to the present disclosure and their equivalents.

What is claimed is:

1. An array substrate, comprising:
 a base substrate;
 a first source-drain metal layer, located above the base substrate and comprising a first signal line extending along a first direction;
 a first insulating layer, located on a side, facing away from the base substrate, of the first source-drain metal layer;
 a second source-drain metal layer, located on a side, facing away from the base substrate, of the first insulating layer and comprising a second signal line extending along the first direction;
 an interlayer insulating layer, located between the base substrate and the first source-drain metal layer;
 a first gate metal layer, located between the interlayer insulating layer and the base substrate and comprising a second power signal line extending in a second direction and a first block electrode electrically connected to the second power signal line;
a first gate insulating layer, located between the base substrate and the first gate metal layer; and
a second gate metal layer, located between the first gate insulating layer and the base substrate and comprising a second block electrode;
wherein:
the first signal line and the second signal line have an overlapping area and are electrically connected through a via hole, running through the first insulating layer, to form a first power signal line;
the second power signal line is electrically connected to the first signal line through a via hole running through the interlayer insulating layer;
the second block electrode and the first block electrode overlap to form a storage capacitor
the second power signal line is electrically connected to the first signal line through the first block electrode; and
the first direction and the second direction intersect.

2. The array substrate of claim 1, wherein an orthographic projection of the first signal line on the base substrate and an orthographic projection of the second signal line on the base substrate overlap.

3. The array substrate of claim 2, wherein a width of the second power signal line is smaller than a width of the first signal line.

4. The array substrate of claim 1, wherein the first signal line and the second signal line are electrically connected through a plurality of via holes running through the first insulating layer.

5. The array substrate of claim 1, further comprising:
an anode layer, located above the second source-drain metal layer; and
a first planarization layer, located between the second source-drain metal layer and the anode layer;
wherein the first source-drain metal layer further comprises a drain, the second source-drain metal layer further comprises a lapped portion, and the drain is electrically connected to the anode layer through the lapped portion.

6. The array substrate of claim 5, wherein:
the lapped portion has a first groove, and a bottom of the first groove is electrically connected to the drain; and
the anode layer has a first connecting portion, and the first connecting portion extends into the first groove through a via hole running through the first planarization layer and is electrically connected to the lapped portion.

7. The array substrate of claim 6, further comprising:
an active layer, located between the second gate metal layer and the base substrate;
wherein:
the drain has a second groove, and a bottom of the second groove is electrically connected to the active layer; and
the lapped portion further has a second connecting portion, and the second connecting portion extends into the second groove and is electrically connected to the drain.

8. The array substrate of claim 6, wherein the first insulating layer comprises:
a passivation layer on a side, facing the second source-drain metal layer, of the first source-drain metal layer; and
a second planarization layer between the passivation layer and the second source-drain metal layer.

9. The array substrate of claim 7, further comprising:
a buffer layer between the active layer and the base substrate; and
a second gate insulating layer between the active layer and the second gate metal layer.

10. A display panel comprising the array substrate of claim 1.

11. A display device comprising the display panel of claim 10.

12. The array substrate of claim 8, wherein a length of the first connecting portion is greater than a thickness of the first planarization layer and less than a sum of the thickness of the first planarization layer and a thickness of the second planarization layer.

13. The array substrate of claim 12, wherein the lapped portion wraps a side wall of the first connecting portion.

14. The array substrate of claim 7, wherein the second connecting portion runs through the interlayer insulating layer and part of the first gate insulating layer.

15. The array substrate of claim 14, wherein the drain wraps a side wall of the second connecting portion.

16. The array substrate of claim 6, further comprising:
a pixel defining layer above the anode layer;
wherein
the pixel defining layer has an opening area that exposes a central area of the anode layer; and
the first signal line and the first connecting portion are at two sides of a center line of the opening area in the first direction.

17. The array substrate of claim 16, further comprising:
a data signal line formed above the interlayer insulating layer and in the first source-drain metal layer;
wherein the data signal line and the first power signal line are at a same side of a center line of the opening area in the first direction.

18. The array substrate of claim 17, wherein the data signal line is farther from the center line of the opening area in the first direction than the first power signal line.

19. The array substrate of claim 1, wherein orthographic projections, on the base substrate, of the via hole running through the interlayer insulating layer and the via hole running through the first insulating layer do not overlap.

* * * * *